United States Patent [19]
Ho

[11] Patent Number: 5,650,922
[45] Date of Patent: Jul. 22, 1997

[54] COMPUTER INTERFACE CARD MOUNTING STRUCTURE

[76] Inventor: Hsin Chien Ho, 20F-1, 268, Sec.1, Wen-Fua Road, Pan Chiao City, Taipei, Taiwan

[21] Appl. No.: 633,392

[22] Filed: Apr. 16, 1996

[51] Int. Cl.⁶ ........................................ H05K 7/14
[52] U.S. Cl. ................ 361/799; 361/753; 361/818; 439/61
[58] Field of Search ................... 361/753, 788, 361/796, 799, 800, 818; 174/35 R, 35 GC, 51, 35 TS; 439/61, 607

[56] References Cited

U.S. PATENT DOCUMENTS

| | | |
|---|---|---|
| 4,768,652 | 9/1988 | Fallon .................... 206/373 |
| 4,873,395 | 10/1989 | Mast ...................... 174/35 GC |
| 4,971,563 | 11/1990 | Wells, III ................ 439/61 |
| 4,979,075 | 12/1990 | Murphy ................... 361/686 |
| 5,004,867 | 4/1991 | Mast ...................... 174/35 GC |
| 5,051,096 | 9/1991 | Cooke et al. ............. 439/61 |
| 5,406,453 | 4/1995 | Cusato et al. ............ 361/733 |
| 5,544,006 | 8/1996 | Radloff et al. ........... 361/683 |
| 5,564,930 | 10/1996 | Yu ........................ 439/61 |
| 5,575,546 | 11/1996 | Radloff .................. 312/183 |

*Primary Examiner*—Michael W. Phillips
*Assistant Examiner*—Phuong T. Vu
*Attorney, Agent, or Firm*—Pro-Techtor International

[57] ABSTRACT

An interface card mounting structure for computers or electronic apparatus includes a card mounting seat, a ground plate and multiple interface cards adapted for use with interface cards or expansion card such as VGA cards, IDE cards, sound cards, etc. The ground plate is fitted onto the card mounting seat before the cards are inserted to ensure tight contact between the cards and the ground plate, to prevent ground damage and to protect the equipment.

1 Claim, 2 Drawing Sheets

5,650,922

COMPUTER INTERFACE CARD MOUNTING STRUCTURE

BACKGROUND OF THE INVENTION (a) Field of the Invention

The present invention relates generally to an interface card mounting structure for computers or electronic apparatus, and more particularly to an interface card mounting structure in which a ground plate is fitted onto a card mounting seat before the interface card is inserted into the card mounting seat so as to ensure tight contact between the interface card and the ground plate.

(b) Description of the Prior Art

Most computers and electronic apparatus are designed to have replaceable or expandable equipment. Generally, interface cards or expansion cards are used to allow expansion of functions. However, most manufacturers have overlooked the need to cope with problems such as electromagnetic interference and ground connection.

SUMMARY OF THE INVENTION

Accordingly, a primary object of the present invention is to provide an interface card mounting structure for computers or electronic apparatus to ensure tight contact between at least one interface card and a ground plate fitted onto a card mounting seat before insertion of the interface card, thereby preventing damage to the ground and protecting the equipment.

BRIEF DESCRIPTION OF THE DRAWINGS

The foregoing and other features and advantages of the present invention will be more clearly understood from the following detailed description and the accompanying drawings, in which.

DETAILED DESCRIPTION OF THE PREFERRED EMBODIMENT

Figure 1:
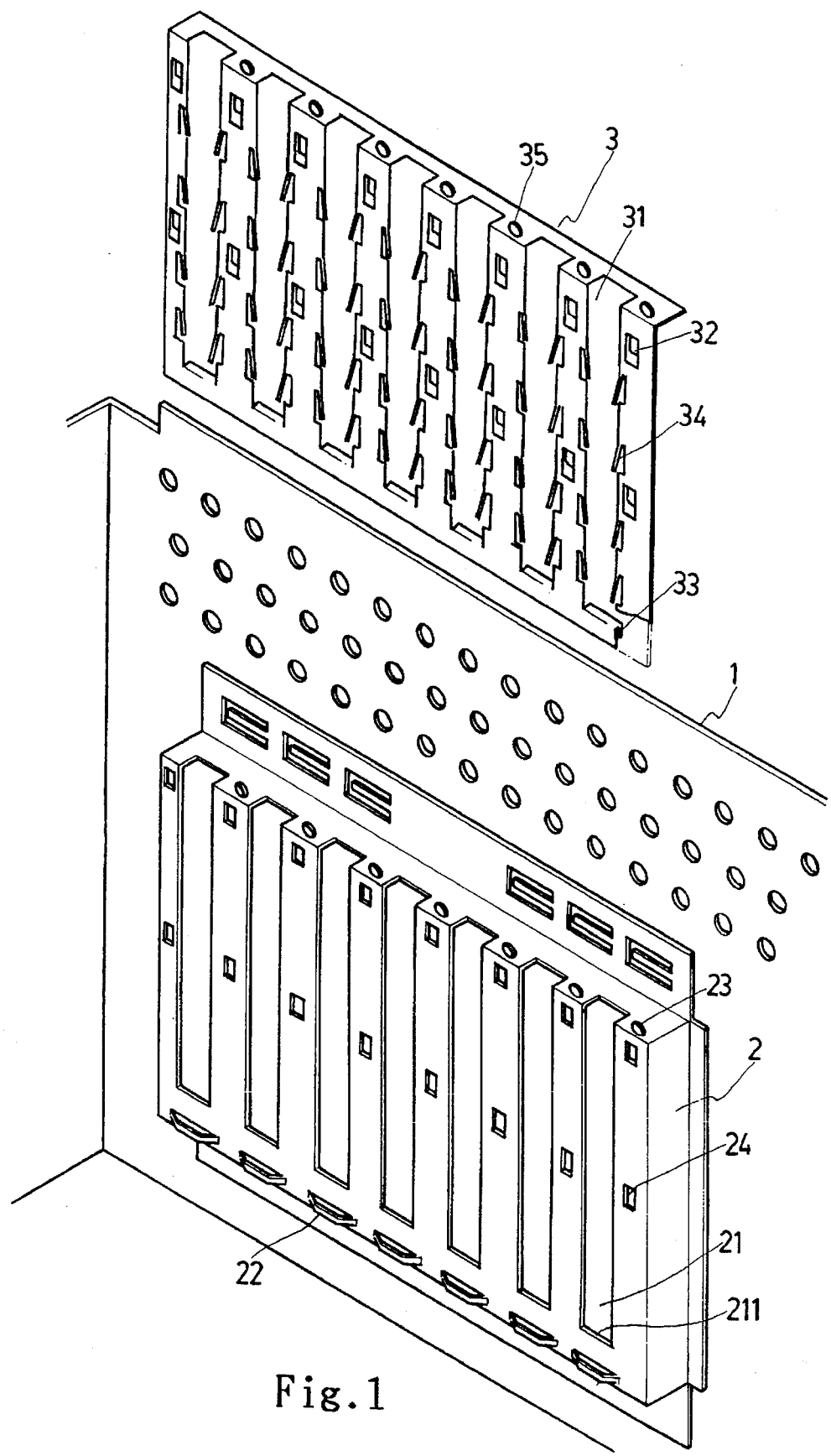
FIG. 1 is an elevational view of a ground plate and a card mounting seat according to the present invention.

With reference to FIG. 1, the present invention is directed to providing a mainframe 1 of a computer or electronic apparatus for accommodating a card mounting seat 2 and a ground plate 3. The card mounting seat 2 has a central, raised portion and is generally secured onto a housing of the mainframe 1. The raised portion of the card mounting seat 2 is provided with a plurality of slots 21, and a retain piece 22 is located below each slot 21. An upper transverse portion of the raised portion of the card mounting seat 2 has a plurality of screw holes 23 suitably located above the slots 21. Besides, both lateral sides of each slot 21 are respectively provided with at least one retain holes 24. The ground plate 3 has a shape substantially identical to that of the card mounting seat 2. It is essentially upright with its upper end bends through substantially 90 degrees to form a transverse portion. The upright surface of the ground plate 3 is provided with a plurality of slots 31 for matching the slots 21 of the card mounting seat 2. The lateral sides of each slot 31 are respectively provided with at least one hooking means 32 for matching the retain holes 24 of the card mounting seat 2. Furthermore, each slot 31 has a retain hook 33 facing substantially downwardly at a lower end thereof, and a plurality of projecting contact pieces 34 at the rims of the lateral sides thereof. Besides, the transverse portion of the ground plate 3 is provided with through holes 35 equivalent to the screw holes 23 of the card mounting seat 2 in number.

Figure 2:
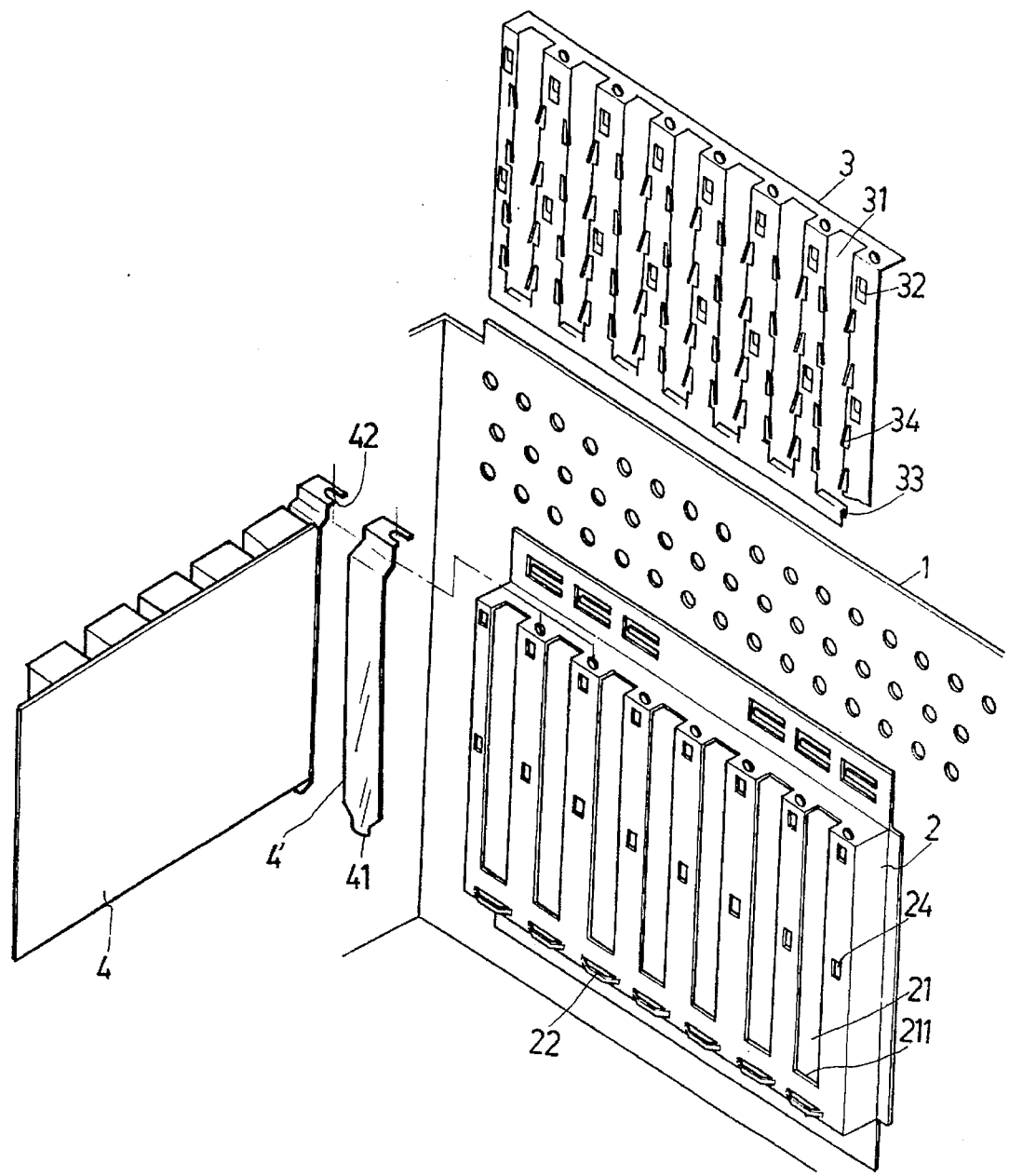
FIG. 2 is an elevational view illustrating the relationship between the card mounting seat, the ground plate and an interface card and a cover strip according to the present invention.

In use, before an interface card 4 is inserted into the card mounting seat 2, the ground plate 3 is fitted into the card mounting seat 2 such that the hooking means 32 of the ground plate 3 may engage the retain holes 24 of the card mounting seat 2, while the retain hooks 33 may engage a cross-section 211 at a bottom end of the slot 21. Such an arrangement not only reinforces the securing effect but also facilitates smooth insertion of a card. Besides, it may prevent the interface card 4 from damaging the ground plate 3 in the process of insertion and may enable the transverse portion of the ground plate 3 to overlap the transverse portion of the raised portion of the card mounting seat 2 such that the through hole 35 and the screw hole 23 are in alignment (see FIG. 2). The interface card 4 or a cover strip 4' with a lower tip 41 is inserted into one of the retain pieces 22 below one of the slots 21, while an upper portion of the interface card 4 or the cover strip 4' is pushed to rest against the transverse portion of the card mounting seat 2 such that a screw may pass through a notch 42 at the upper end of the interface card 4 or the cover strip 4' and one of the through holes 35 of the ground plate 3 into one of the screw holes 23 of the card mounting seat 2 to fasten them securely together. In this way, the projecting contact pieces 34 at both sides of each slot 31 may tightly contact the interface card 4, achieving good ground connection between the interface card 4 and the mainframe 1.

Although the present invention has been illustrated and described with reference to the preferred embodiment thereof, it should be understood that it is in no way limited to the details of such embodiment but is capable of numerous modifications within the scope of the appended claims.

What is claimed is:

1. A computer card mounting structure, comprising, a card mounting seat having a centrally raised portion welded or screwed onto a housing of a mainframe, said raised portion having a plurality of slots provided thereon, each of said slots having a cross-section at a bottom end thereof, a retain piece being located below each of said slots for retaining a bottom tip of an expansion card or an interface card, an upper transverse portion of said raised portion having a plurality of screw holes above said slots, each of said slots being further provided with at least one retain hole at either lateral side thereof;

a ground plate having a shape resembling that of said card mounting seat and consisting of an upright surface and a transverse portion bent at a right angle thereto, said upright surface being provided with a plurality of slots for matching said slots of said card mounting seat, each of said slots of said ground plate having at least one hooking means at either lateral side thereof engaging said retain holes of each of said slots of said card mounting seat, each of said slots of said ground plate having a retain hook facing substantially downwardly at a bottom end thereof, and a plurality of projecting contact pieces at both lateral sides thereof, said transverse portion of said ground plate being provided with a plurality of through holes for matching said screw holes of said card mounting seat; and at least one interface card with a bottom tip, said bottom tip being fitted into one of said retain pieces of said card mounting seat after said ground plate is inserted into said card mounting seat such that said hooking means of said ground plate engage said retain holes of said card mounting seat and said retain hooks of said ground plate engage said cross-sections of said slots of said card mounting seat, a screw being passed through a notch at an upper end of said at least one interface card and one of said through holes of said ground plate into said one of said screw holes of said card mounting seat to fasten them securely together, achieving tight contact between said contact pieces of said ground plate and said at least one interface card.

* * * * *